(12) United States Patent
Xie (10) Patent No.: US 10,177,246 B2
(45) Date of Patent: Jan. 8, 2019

(54) SEMICONDUCTOR STRUCTURE AND FABRICATION METHOD THEREOF (71) Applicants: Semiconductor Manufacturing International (Shanghai) Corporation, Shanghai (CN); Semiconductor Manufacturing International (Beijing) Corporation, Beijing (CN)

(72) Inventor: Xin Yun Xie, Shanghai (CN)

(73) Assignees: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

( * ) Notice: Subject to any disclaimer, the term of this patent is extended or adjusted under 35 U.S.C. 154(b) by 0 days.

(21) Appl. No.: 15/666,838

(22) Filed: Aug. 2, 2017

(65) Prior Publication Data
US 2018/0047831 A1  Feb. 15, 2018

(30) Foreign Application Priority Data
Aug. 12, 2016 (CN) .......................... 2016 1 0666918

(51) Int. Cl.
*H01L 29/66* (2006.01)
*H01L 21/265* (2006.01)
(Continued)

(52) U.S. Cl.
CPC .. *H01L 29/66795* (2013.01); *H01L 21/26513* (2013.01); *H01L 21/30625* (2013.01);
(Continued)

(58) Field of Classification Search
CPC ......... H01L 29/66795; H01L 21/26513; H01L 21/30625; H01L 21/76224;
(Continued)

(56) References Cited

U.S. PATENT DOCUMENTS 5,674,784 A 10/1997 Jang et al.
8,431,453 B2 * 4/2013 Huang .................. H01L 27/088
257/369

(Continued)

FOREIGN PATENT DOCUMENTS

CN        104078357 A       10/2014

OTHER PUBLICATIONS

The European Patent Office (EPO) The Extended European Search Report for 17185879.8 dated Jan. 16, 2018 8 Pages.

*Primary Examiner* — Fernando L Toledo
*Assistant Examiner* — Neil Prasad
(74) *Attorney, Agent, or Firm* — Anova Law Group, PLLC (57) ABSTRACT

A semiconductor structure and a method for fabricating the semiconductor structure are provided. The method includes providing a plurality of dummy gates on a substrate, a capping layer on each dummy gate, and a dielectric layer over the substrate, wherein the dielectric layer has a top surface above each dummy gate. The method also includes performing a first ion implantation process on the dielectric layer to form a first stop layer in the dielectric layer. A top surface of the first stop layer is above or coplanar with a top surface of each dummy gate. Further, the method includes performing a first planarization process on the capping layer and the dielectric layer to expose the top surface of each dummy gate. A removal rate of the first stop layer is smaller than a removal rate of the dielectric layer when performing the first planarization process.

20 Claims, 5 Drawing Sheets (51) Int. Cl.
*H01L 21/306* (2006.01)
*H01L 21/762* (2006.01)
*H01L 21/768* (2006.01)
*H01L 29/06* (2006.01)
*H01L 29/417* (2006.01)
*H01L 29/423* (2006.01)
H01L 21/8234 (2006.01)

(52) U.S. Cl.
CPC .. *H01L 21/76224* (2013.01); *H01L 21/76829* (2013.01); *H01L 21/823481* (2013.01); *H01L 29/0649* (2013.01); *H01L 29/41791* (2013.01); *H01L 29/4236* (2013.01); *H01L 29/66545* (2013.01); H01L 21/823431 (2013.01)

(58) Field of Classification Search
CPC ....... H01L 21/76829; H01L 21/823481; H01L 29/0649; H01L 29/41791; H01L 29/4236; H01L 29/66545; H01L 21/823431
See application file for complete search history.

(56) References Cited

U.S. PATENT DOCUMENTS

| | | | |
|---|---|---|---|
| 2010/0163994 A1 | 7/2010 | Kurz et al. | |
| 2010/0330790 A1 | 12/2010 | Hempel et al. | |
| 2014/0124873 A1* | 5/2014 | Jagannathan | H01L 29/49 257/407 |
| 2016/0149015 A1* | 5/2016 | Cai | H01L 29/66545 257/401 |

* cited by examiner

SEMICONDUCTOR STRUCTURE AND FABRICATION METHOD THEREOF

CROSS-REFERENCES TO RELATED APPLICATIONS

This application claims the priority of Chinese patent application No. 201610666918.9, filed on Aug. 12, 2016, the entirety of which is incorporated herein by reference.

FIELD OF THE DISCLOSURE

The present disclosure generally relates to the field of semiconductor manufacturing technology and, more particularly, relates to a semiconductor structure and fabrication method thereof.

BACKGROUND

With continuous development of semiconductor technology, dimensions of semiconductor devices continue to decrease. The reduction of the critical dimensions of the semiconductor devices means a greater number of transistors can be placed on a single chip, which raises higher requirements for the semiconductor process.

To overcome short-channel effect, suppress leakage current and lower threshold voltage of the transistor, a high dielectric constant insulating layer and metal gate (High-K metal gate, HKMG) technology has been developed. In the HKMG technology, a high-K gate dielectric layer is used to replace a traditional $SiO_2$ gate dielectric layer, and a metal material gate is used to replace a silicon material gate. When forming a HKMG structure by a gate-last process, because the metal gate is formed after forming source and drain doped regions, the metal gate is not under the high temperature used for forming the source and drain doped regions, the metal gate is not easily deformed. The gate-last process is used to form the HKMG structure.

The gate-last process for forming the HKMG structure includes: forming a dummy gate structure on a substrate; forming source and drain doped regions in the substrate on both sides of the dummy gate structure; forming a dielectric layer to cover top and sidewalls of the dummy gate structure; removing the dielectric layer on the top of the dummy gate structure to form an isolation dielectric layer; and removing the dummy gate structure.

However, when removing the dielectric layer on the top of the dummy gate structure, the insulation performance of the isolation dielectric layer formed between transistors is easily degraded, and the performance of the formed semiconductor structure is affected. The disclosed device structures and methods are directed to solve one or more problems set forth above and other problems.

BRIEF SUMMARY OF THE DISCLOSURE

One aspect of the present disclosure includes a method for fabricating a semiconductor structure. The method includes providing a plurality of dummy gates on a substrate, a capping layer on each dummy gate, and a dielectric layer over the substrate, wherein the dielectric layer has a top surface above each dummy gate. The method also includes performing a first ion implantation process on the dielectric layer to form a first stop layer in the dielectric layer. A top surface of the first stop layer is above or coplanar with a top surface of each dummy gate. Further, the method includes performing a first planarization process on the capping layer and the dielectric layer to expose the top surface of each dummy gate. A removal rate of the first stop layer is smaller than a removal rate of the dielectric layer when performing the first planarization process.

Other aspects of the present disclosure can be understood by those skilled in the art in light of the description, the claims, and the drawings of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or the alike parts.

Figure 1:
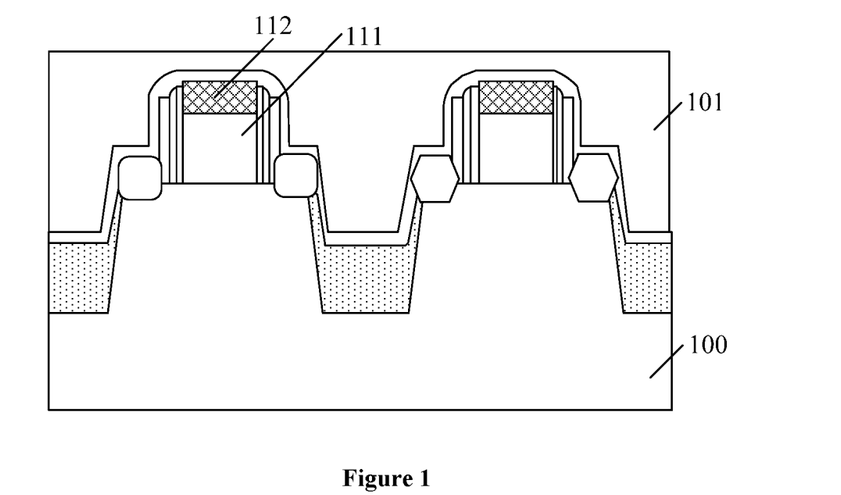
FIGS. 1-2 illustrate semiconductor structures corresponding to certain stages for forming a semiconductor structure.
Figure 2:
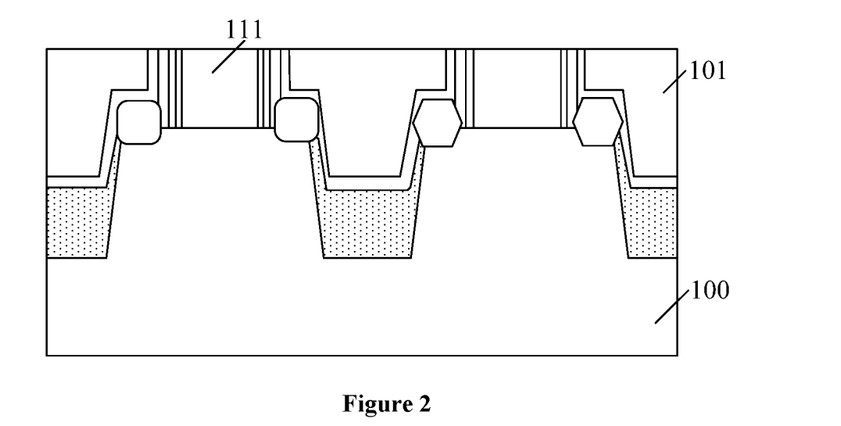

FIGS. 1-2 illustrate semiconductor structures corresponding to certain stages for forming a semiconductor structure. Referring to FIG. 1, a substrate 100 is provided and a dummy gate structure is formed on the substrate 100. The dummy gate structure includes a dummy gate 111 formed on the substrate 100 and a mask layer 112 formed on the dummy gate 111. A dielectric layer 101 is formed on the substrate 100 to cover top and sidewalls of the dummy gate structure.

Referring to FIG. 2, the dielectric layer 101 on the top of the dummy gate structure is removed by a chemical mechanical polishing process. After removing the dielectric layer 101 on the top of the dummy gate structure, the mask layer 112 (shown in FIG. 1) is removed.

After removing the mask layer 112, the dummy gate structure is removed to form an opening in the dielectric layer 101. A metal gate layer is formed in the opening and on the dielectric layer 101. The metal gate layer on the dielectric layer 101 is removed to form a metal gate.

Because the distance between the adjacent dummy gate structures is small, the dielectric layer 101 is poor in denseness when forming the dielectric layer 101. When removing the dielectric layer 101 and the mask layer 112 on the top of the dummy gate structure, a removal rate of the dielectric layer 101 is greater than a removal rate of the mask layer 112. Therefore, after the mask layer 112 is exposed, pits are easily formed in the dielectric layer 101 between the gate structures. In addition, when removing the mask layer 112, the removal rate of the dielectric layer 101 between the dummy gate structures is greater than a removal rate of the dummy gate 111. Thus, after the dummy gate 111 is exposed, pits are easily formed in the dielectric layer 101 between the dummy gate structures.

When forming the metal gate layer, the metal gate layer easily fills the pits. When removing the metal gate layer on the dielectric layer 101, it is difficult to remove the metal gate layer in the pits. Therefore, the pits easily reduce the insulation performance of the dielectric layer 101 between the dummy gate structures, and the performance of the formed semiconductor structure is affected.

Figure 7:
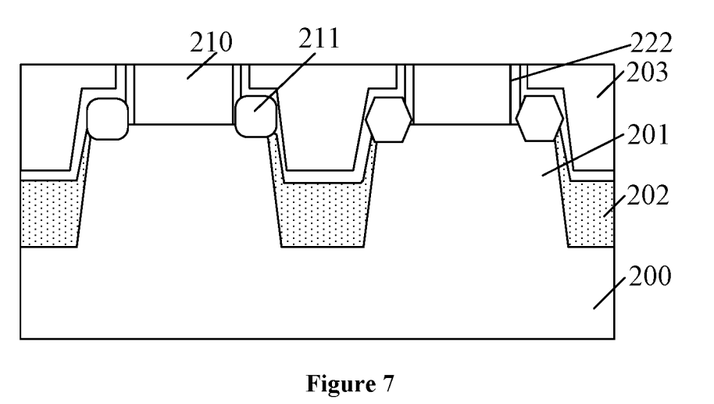
Figure 8:
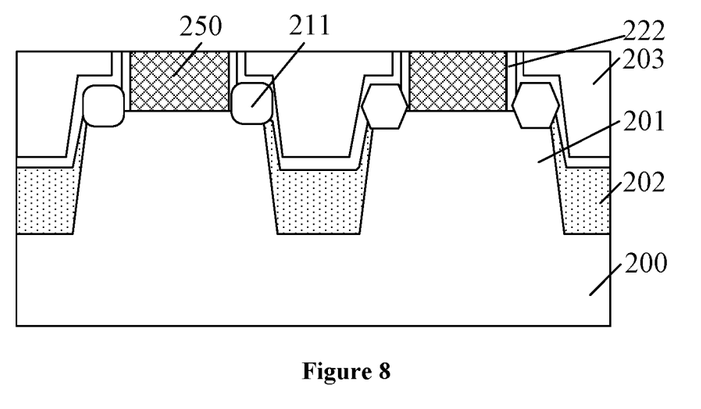
Figure 9:
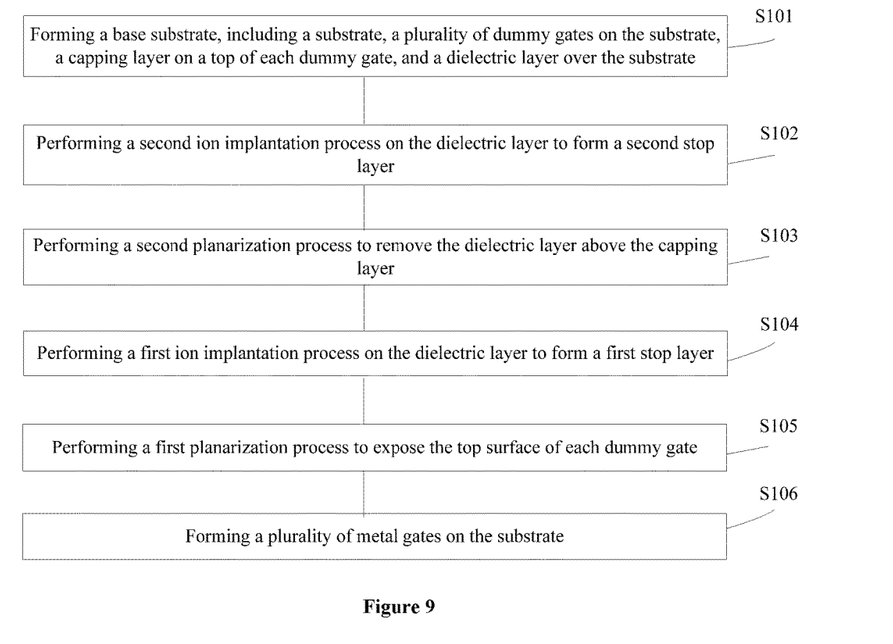
FIG. 9 illustrates an exemplary fabrication method for forming a semiconductor structure consistent with various disclosed embodiments of the present disclosure.

The present disclosure provides a semiconductor structure and fabrication method thereof. FIG. 9 illustrates an exemplary fabrication method for forming a semiconductor structure consistent with various disclosed embodiments of the present disclosure; and FIGS. 3-8 illustrate semiconductor structures corresponding to certain stages of the exemplary fabrication method.

Figure 3:
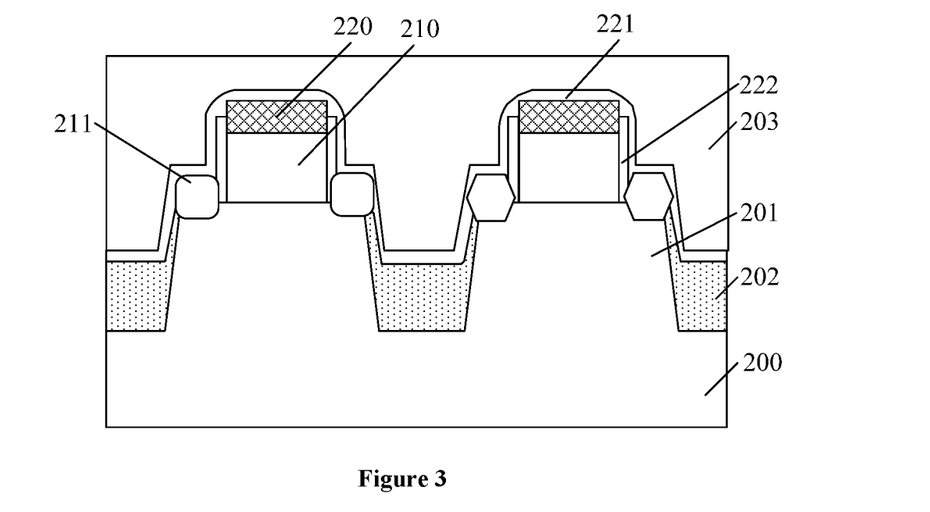
FIGS. 3-8 illustrate semiconductor structures corresponding to certain stages of an exemplary fabrication method for forming a semiconductor structure consistent with various disclosed embodiments of the present disclosure.

As shown in FIG. 9, at the beginning of the fabrication method, a base substrate with certain structures may be provided (S101). FIG. 3 illustrates a corresponding semiconductor structure.

Referring to FIG. 3, in one embodiment, a substrate, including a bottom substrate 200 and a plurality of fins 201 formed on the bottom substrate 200, may be provided. In certain embodiments, the substrate may be a planar substrate. A plurality of dummy gates 210 may be formed on the substrate. A capping layer 220 may be formed on top of each dummy gate 210. A dielectric layer 203 may also be formed over the substrate. The surface of the dielectric layer 203 may be above the top surface of each dummy gate 210.

In one embodiment, the bottom substrate 200 may be a silicon substrate. In certain embodiments, the bottom substrate 200 may be a germanium substrate, a silicon germanium substrate, a silicon on insulator substrate, a germanium on insulator substrate, or other semiconductor substrates. In one embodiment, the fins 201 may be made of silicon. In certain embodiments, the fins 201 may be made of germanium, or silicon germanium, etc. In one embodiment, the dummy gates 210 may be made of polysilicon. In certain embodiments, the dummy gates 210 may be made of germanium, or silicon germanium, etc. In one embodiment, the capping layer 220 may be a mask layer, and may be made of a material different from the dielectric layer 203. For example, the capping layer 220 may be made of silicon nitride, and the dielectric layer 203 may be made of silicon oxide. In certain embodiments, the dielectric layer 203 may be made of silicon oxynitride.

In one embodiment, a base substrate may include the substrate, the dummy gates 210, the capping layer 220, and the dielectric layer 203. A method for forming the base substrate may include: providing the substrate; forming a dummy gate layer on the substrate; forming a patterned capping layer 220 on the dummy gate layer; patterning the dummy gate layer with the capping layer 220 as an etching mask to form the dummy gates 210; and forming the dielectric layer 203 over the substrate. The surface of the dielectric layer 203 may be above the top surface of each dummy gate 210.

In one embodiment, the base substrate may include the plurality of fins 201 and the plurality of dummy gates 210 formed on the fins 201. In one embodiment, the base substrate may also include an isolation structure 202 formed on the bottom substrate 200. The isolation structure 202 may cover portions of sidewalls of each fin 201. The surface of the isolation structure 202 may be lower than the top surface of each fin 201. In one embodiment, the isolation structure 202 may be made of silicon oxide. In certain embodiments, the isolation structure 202 may be made of silicon oxynitride.

In one embodiment, moreover, the base substrate may include a dummy gate dielectric layer (not illustrated) formed between each dummy gate 210 and each fin 201. In one embodiment, the dummy gate dielectric layer may be made of silicon oxide. In one embodiment, in addition, the base substrate may include source and drain doped regions 211 formed in each fin 201 on both sides of each dummy gate 210.

When the source and drain doped regions 211 are used to form an NMOS transistor, the source and drain doped regions 211 may be made of carbon silicon. The lattice constant of the carbon silicon is smaller than the lattice constant of the fin 201, thus the source and drain doped regions 211 can provide tensile stress to channels of the formed transistor.

When the source and drain doped regions 211 are used to form a PMOS transistor, the source and drain doped regions 211 may be made of silicon germanium. The lattice constant of the silicon germanium is larger than the lattice constant of the fin 201, thus the source and drain doped regions 211 can provide compressive stress to the channels of the formed transistor.

In one embodiment, further, the base substrate may include a barrier layer 221 formed on the surfaces of the capping layer 220 and the source and drain doped regions 211. The barrier layer 221 may be made of silicon nitride. In one embodiment, further, the base substrate may also include a sidewall spacer 222 formed between the barrier layer 221 and each dummy gate 210.

A first ion implantation process may be subsequently performed on the dielectric layer 203 to form a first stop layer in the dielectric layer 203. The top surface of the first stop layer may be above or coplanar with the top surface of each dummy gate 210.

Figure 4:
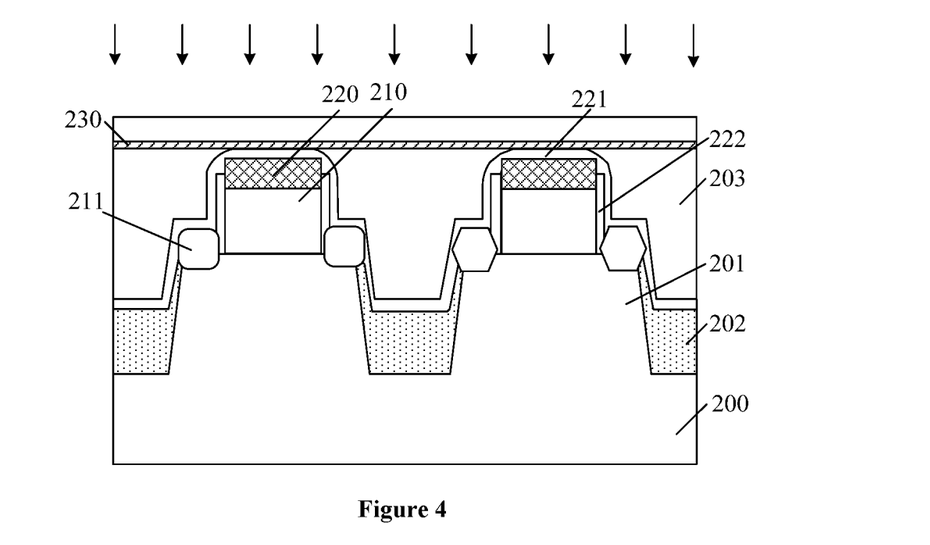

Returning to FIG. 9, after forming the base substrate, a second ion implantation process may be performed on the dielectric layer to form a second stop layer (S102). FIG. 4 illustrates a corresponding semiconductor structure.

Referring to FIG. 4, before performing the first ion implantation process, a second ion implantation process may be performed on the dielectric layer 203 to form a second stop layer 230. The top surface of the second stop layer 230 may be above or coplanar with the top surface of the capping layer 220. The removal rate of the second stop layer 230 may be smaller than the removal rate of the dielectric layer 203 when subsequently performing a second planarization process. Thus, the second stop layer 230 may be used as a planarization stop layer when subsequently performing the second planarization process on the dielectric layer 203.

In one embodiment, the bottom surface of the second stop layer 230 may be coplanar with the top surface of the barrier layer 221. In certain embodiments, the bottom surface of the second stop layer 230 may be coplanar with or lower than the top surface of the capping layer 220.

In one embodiment, the dielectric layer 203 may be made of silicon oxide, and the capping layer 220 may be made of silicon nitride. The implanted ions of the second ion implantation process may be nitrogen ions, thus the second stop layer 230 may be made of silicon oxynitride. The removal rate of the silicon oxynitride may be close to the removal rate of the capping layer 220 when subsequently performing the second planarization process. Therefore, when performing the second planarization process, the removal rate of the second stop layer 230 may be low. The second stop layer 230 can protect the dielectric layer 203 between the adjacent dummy gates 210, and avoid the formation of pits in the dielectric layer 203 between the adjacent dummy gates 210 caused by too large removal rate of the dielectric layer 203.

If the thickness of the second stop layer 230 is too small, the second stop layer 230 cannot effectively protect the dielectric layer 203 over the substrate, and cannot effectively reduce the amount of pits formed in the dielectric layer 203 between the adjacent dummy gates 210. If the thickness of the second stop layer 230 is too large, it may easily waste materials and energy. Therefore, in one embodiment, the thickness of the second stop layer 230 may be in a range of approximately 50 nm-100 nm.

In one embodiment, the bottom surface of the second stop layer 230 formed by the second ion implantation process may be coplanar with the top surface of the barrier layer 221. In one embodiment, the process doping of the second ion implantation process may include an implantation dose in a range of approximately $1.0 \times 10^{14}$ atoms/cm$^3$-$6.0 \times 10^{15}$ atoms/cm$^3$.

Figure 5:
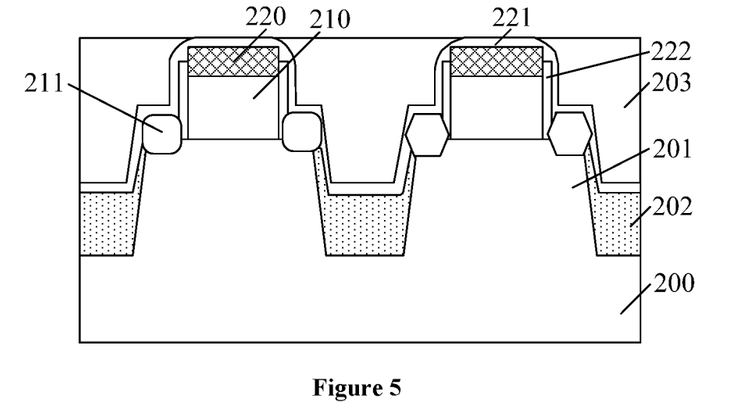

Returning to FIG. 9, after forming the second stop layer, a second planarization process may be performed to remove the dielectric layer above the capping layer (S103). FIG. 5 illustrates a corresponding semiconductor structure.

Referring to FIG. 5, after performing the second ion implantation process, a second planarization process may be performed on the dielectric layer 203 to remove the dielectric layer 203 above the capping layer 220. When performing the second planarization process, the removal rate of the second stop layer 230 (shown in FIG. 4) may be smaller than the removal rate of the dielectric layer 203. Therefore, the second stop layer 230 can protect the dielectric layer 203 over the substrate 200, and avoid the formation of pits in the dielectric layer 203 over the substrate 200 caused by too large removal rate of the dielectric layer 203.

In one embodiment, the second planarization process may also include removing the second stop layer 230 to expose the barrier layer 221. In one embodiment, the second planarization process performed to remove the dielectric layer 203 above the capping layer 220 may include a chemical mechanical polishing process.

Figure 6:
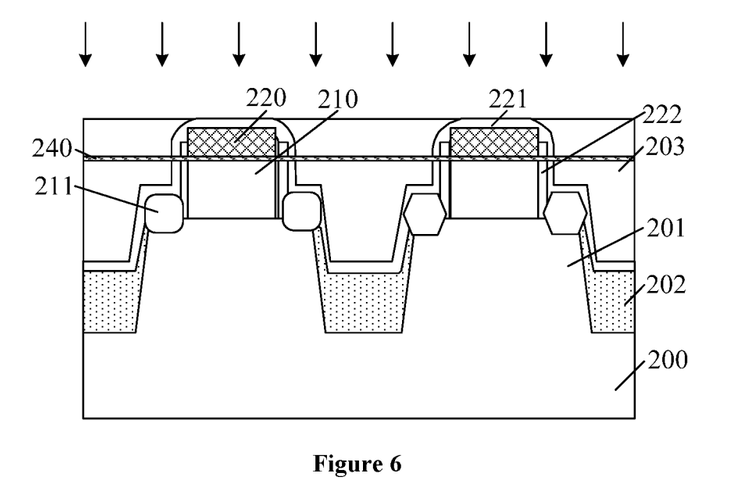

Returning to FIG. 9, after removing the dielectric layer above the capping layer, a first ion implantation process may be performed on the dielectric layer to form a first stop layer (S104). FIG. 6 illustrates a corresponding semiconductor structure.

Referring to FIG. 6, a first ion implantation process may be performed on the dielectric layer 203 to form a first stop layer 240 in the dielectric layer 203. The top surface of the first stop layer 240 may be above or coplanar with the top surface of each dummy gate 210. The removal rate of the first stop layer 240 may be smaller than the removal rate of the dielectric layer 203 when subsequently performing a first planarization process. Thus, the first stop layer 240 may be used as a planarization stop layer when subsequently performing the first planarization process.

In one embodiment, the bottom surface of the first stop layer 240 may be coplanar with the top surface of each dummy gate 210. In certain embodiments, the bottom surface of the first stop layer 240 may be above or lower than the top surface of each dummy gate 210.

In one embodiment, the dummy gates 210 may be made of silicon. The implanted ions of the first ion implantation process may be silicon ions. The removal rate of the first stop layer 240 formed by implanting silicon ions into the dielectric layer 203 may be close to the removal rate of the dummy gates 210 when subsequently performing the first planarization process. Therefore, when performing the first planarization process, the removal rate of the first stop layer 240 may be low. The first stop layer 240 can protect the dielectric layer 203 between the adjacent dummy gates 210, and avoid the formation of pits in the dielectric layer 203 between the adjacent dummy gates 210 caused by too large removal rate of the dielectric layer 203.

If the thickness of the first stop layer 240 is too small, the first stop layer 240 cannot effectively protect the dielectric layer 203 between the adjacent dummy gates 210, and cannot effectively reduce the amount of pits formed in the dielectric layer 203 between the adjacent dummy gates 210. If the thickness of the first stop layer 240 is too large, it may easily waste materials and energy. Therefore, in one embodiment, the thickness of the first stop layer 240 may be in a range of approximately 50 nm-100 nm.

In one embodiment, the bottom surface of the first stop layer 240 formed by the first ion implantation process may be coplanar with the top surface of each dummy gate 210. In one embodiment, the first planarization process may also include removing the first stop layer 240 to expose the top surface of each dummy gate 210.

In one embodiment, the process doping of the first ion implantation process may include an implantation dose in a range of approximately $1.0 \times 10^{14}$ atoms/cm$^3$-$6.0 \times 10^{15}$ atoms/cm$^3$.

In one embodiment, the first ion implantation process may be performed after performing the second planarization process on the dielectric layer 203. In another embodiment, the first ion implantation process may be performed before performing the second planarization process on the dielectric layer 203. For example, the first ion implantation process may be performed before performing the second ion implantation process; or the first ion implantation process may be performed after performing the second ion implantation process.

Returning to FIG. 9, after forming the first stop layer, a first planarization process may be performed to expose the top surface of each dummy gate (S105). FIG. 7 illustrates a corresponding semiconductor structure.

Referring to FIG. 7, a first planarization process may be performed on the dielectric layer 203 and the capping layer 220 to expose the top surface of each dummy gate 210. When performing the first planarization process, the removal rate of the first stop layer 240 may be smaller than the removal rate of the dielectric layer 203. Therefore, the first stop layer 240 can protect the dielectric layer 203 between the adjacent dummy gates 210, and avoid the formation of pits in the dielectric layer 203 between the adjacent dummy gates 210 caused by too large removal rate of the dielectric layer 203.

In one embodiment, the first planarization process performed on the dielectric layer 203 and the capping layer 220 may include a chemical mechanical polishing process. In one embodiment, the base substrate may include the barrier layer 221 formed on the capping layer 220. The barrier layer 221 on the capping layer 220 may also be removed when performing the first planarization process. After performing the first planarization process, the dummy gates 210 may be removed to form trenches.

Returning to FIG. 9, after forming the trenches, a plurality of metal gates may be formed (S106). FIG. 8 illustrates a corresponding semiconductor structure.

Referring to FIG. 8, after forming the trenches, a plurality of metal gates 250 may be formed in the trenches. A method for forming the metal gates 250 may include: forming a metal gate layer in the trenches and on the dielectric layer 203; and removing the metal gate layer on the dielectric layer 203. A transistor channel may be formed in each fin 201 under each metal gate 250.

In one embodiment, because the surface of the dielectric layer 203 is flat, the metal gate layer on the dielectric layer 203 may be easily removed when forming the metal gates 250. Thus, the insulation performance of the dielectric layer 203 may not be degraded. Therefore, the performance of the formed semiconductor structure may be improved.

In one embodiment, a gate-last process used to form a metal gate structure is described herein as an example. In another embodiment, the various embodiments can also be used to form a polysilicon gate transistor. The dummy gate may provide a space for forming a polysilicon gate of the polysilicon gate transistor. In certain embodiments, the various embodiments can also be used to form other semiconductor structures.

Accordingly, the first ion implantation process may be performed on the dielectric layer to form the first stop layer before performing the first planarization process. The removal rate of the first stop layer may be smaller than the removal rate of the dielectric layer when performing the first planarization process on the dielectric layer and the capping layer. As a result, the first stop layer may be used as the planarization stop layer of the first planarization process, protect the dielectric layer under the first stop layer, and avoid the formation of pits caused by too large removal rate of the dielectric layer. Therefore, the various embodiments can improve the insulation performance of the dielectric layer over the substrate, and improve the performance of the formed semiconductor structure.

Further, the capping layer may be made of the material different from the dielectric layer, and the dielectric layer may be above the capping layer. Before removing the dielectric layer above the capping layer, a second ion implantation process may be performed on the dielectric layer to form the second stop layer. The removal rate of the second stop layer may be smaller than the removal rate of the dielectric layer when performing the second planarization process on the dielectric layer above the capping layer. As a result, the second stop layer can avoid the formation of pits in the dielectric layer when performing the second planarization process. Therefore, the various embodiments can further improve the insulation performance of the dielectric layer over the substrate, and further improve the performance of the formed semiconductor structure.

The above detailed descriptions only illustrate certain exemplary embodiments of the present disclosure, and are not intended to limit the scope of the present disclosure. Those skilled in the art can understand the specification as a whole and technical features in the various embodiments can be combined into other embodiments understandable to those persons of ordinary skill in the art. Any equivalent or modification thereof, without departing from the spirit and principle of the present disclosure, falls within the true scope of the present disclosure.

What is claimed is:

1. A method for fabricating a semiconductor structure, comprising:
providing a plurality of dummy gates on a substrate, a capping layer on each dummy gate, and a dielectric layer over the substrate, wherein the dielectric layer has a top surface above each dummy gate;
performing a first ion implantation process on the dielectric layer to form a first stop layer in the dielectric layer, wherein a bottom surface of the first stop layer is coplanar with a top surface of each dummy gate; and
performing a first planarization process on the capping layer and the dielectric layer exposing the top surface of each dummy gate and a top surface of the dielectric layer under the first stop layer, wherein a removal rate of the first stop layer is smaller than a removal rate of the dielectric layer when performing the first planarization process.

2. The method according to claim 1, wherein:
the dummy gate is made of silicon.

3. The method according to claim 2, wherein:
implanted ions of the first ion implantation process are silicon ions, and
an implantation dose of the first ion implantation process is in a range of approximately $1.0 \times 10^{14}$ atoms/cm$^3$-$6.0 \times 10^{15}$ atoms/cm$^3$.

4. The method according to claim 1, wherein:
a thickness of the first stop layer is in a range of approximately 50 nm 100 nm.

5. The method according to claim 1, wherein the first planarization process includes:
a chemical mechanical polishing process.

6. The method according to claim 1, wherein:
the capping layer is made of a material different from the dielectric layer, and
the dielectric layer is above the capping layer.

7. The method according to claim 6, before performing the first planarization process, further including:
performing a second planarization process on the dielectric layer to remove the dielectric layer above the capping layer.

8. A method for fabricating a semiconductor structure, comprising:
providing a plurality of dummy gates on a substrate, a capping layer on each dummy gate, and a dielectric layer over the substrate, wherein the dielectric layer has a top surface above each dummy gate, wherein the capping layer is made of a material different from the dielectric layer, and the dielectric layer is above the capping layer;
performing a first ion implantation process on the dielectric layer to form a first stop layer in the dielectric layer, wherein a top surface of the first stop layer is above or coplanar with a top surface of each dummy gate;
performing a second ion implantation process on the dielectric layer to form a second stop layer, wherein a top surface of the second stop layer is above or coplanar with a top surface of the capping layer;
performing a second planarization process on the dielectric layer to remove the dielectric layer above the capping layer; and
performing a first planarization process on the capping layer and the dielectric layer to expose the top surface of each dummy gate, wherein a removal rate of the first stop layer is smaller than a removal rate of the dielectric layer when performing the first planarization process.

9. The method according to claim 8, wherein:
a removal rate of the second stop layer is smaller than the removal rate of the dielectric layer when performing the second planarization process.

10. The method according to claim 9, wherein:
the capping layer is made of silicon nitride, and
the dielectric layer is made of silicon oxide.

11. The method according to claim 10, wherein:
implanted ions of the second ion implantation process are nitrogen ions, and
an implantation dose of the second ion implantation process is in a range of approximately $1.0 \times 10^{14}$ atoms/cm$^3$-$6.0 \times 10^{15}$ atoms/cm$^3$.

12. The method according to claim 8, wherein:
a thickness of the second stop layer is in a range of approximately 50 nm 100 nm.

13. The method according to claim 7, wherein the second planarization process includes:
a chemical mechanical polishing process.

14. The method according to claim 7, wherein:
the second planarization process is performed on the dielectric layer before performing the first ion implantation process.
15. The method according to claim 7, wherein:
the second planarization process is performed on the dielectric layer after performing the first ion implantation process.
16. The method according to claim 8, wherein:
the second ion implantation process is performed before performing the first ion implantation process.
17. The method according to claim 8, wherein:
the second ion implantation process is performed after performing the first ion implantation process.
18. The method according to claim 8, wherein:
a bottom surface of the second stop layer is coplanar with, lower than, or above the top surface of the capping layer.
19. The method according to claim 1, wherein:
a bottom surface of the first stop layer is coplanar with, lower than, or above the top surface of each dummy gate.
20. The method according to claim 1, after performing the first planarization process, further including:
removing the plurality of dummy gates to form trenches in the dielectric layer,
forming a metal gate layer in the trenches and on the dielectric layer, and
removing the metal gate layer on the dielectric layer to form a plurality of metal gates.

* * * * *